United States Patent
Bang et al.

(10) Patent No.: US 11,069,481 B2
(45) Date of Patent: *Jul. 20, 2021

(54) MULTILAYER CERAMIC ELECTRONIC COMPONENT AND BOARD FOR MOUNTING OF THE SAME

(71) Applicant: SAMSUNG ELECTRO-MECHANICS CO., LTD., Suwon-si (KR)

(72) Inventors: Hye Min Bang, Suwon-si (KR); Bum Su Kim, Suwon-si (KR); Hyun Hee Gu, Suwon-si (KR); Hee Sang Kang, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/669,911

(22) Filed: Oct. 31, 2019

(65) Prior Publication Data

US 2020/0066451 A1    Feb. 27, 2020

Related U.S. Application Data

(63) Continuation of application No. 16/181,053, filed on Nov. 5, 2018, now Pat. No. 10,573,460.

(30) Foreign Application Priority Data

Jun. 19, 2018   (KR) .................. 10-2018-0069956

(51) Int. Cl.
*H01G 4/008* (2006.01)
*H01G 4/012* (2006.01)
(Continued)

(52) U.S. Cl.
CPC ......... *H01G 4/2325* (2013.01); *H01G 4/0085* (2013.01); *H01G 4/012* (2013.01);
(Continued)

(58) Field of Classification Search
CPC ........ H01G 2/06; H01G 4/0085; H01G 4/012; H01G 4/232; H01G 4/2325; H01G 4/248;
(Continued)

(56) References Cited

U.S. PATENT DOCUMENTS 4,192,063 A * 3/1980 Sato ................. H01L 21/4878
228/155
4,604,676 A  8/1986 Senda et al.
(Continued)

FOREIGN PATENT DOCUMENTS

JP  H11-307391 A  11/1999
JP  2007-115755 A   5/2007
(Continued)

OTHER PUBLICATIONS

Office Action issued in Korean Patent Application No. 10-2008-0069956 dated May 26, 2019, with English translation.
(Continued)

*Primary Examiner* — Timothy J Thompson
*Assistant Examiner* — Guillermo J Egoavil
(74) *Attorney, Agent, or Firm* — Morgan, Lewis & Bockius LLP (57) ABSTRACT

A multilayer ceramic electronic component includes a ceramic body including a dielectric layer, first and second internal electrodes disposed to face each other with the dielectric layer interposed therebetween in the ceramic body, and first and second external electrodes disposed on external surfaces of the ceramic body and electrically connected to the first and second electrodes. At least one of the first and second external electrodes includes a first electrode layer
(Continued)

including a first glass and a second electrode layer disposed on the first electrode layer and including a second glass. The first glass contains a larger amount of barium-zinc (Ba—Zn) than the second glass, and the second glass contains a larger amount of silicon (Si) than the first glass.

18 Claims, 5 Drawing Sheets

(51) Int. Cl.
  *H01G 4/232* (2006.01)
  *H01G 4/248* (2006.01)
  *H01G 4/30* (2006.01)
  *H05K 1/18* (2006.01)
  *H01G 4/12* (2006.01)
  *H05K 1/11* (2006.01)

(52) U.S. Cl.
  CPC ............... *H01G 4/248* (2013.01); *H01G 4/30* (2013.01); *H05K 1/181* (2013.01); *H01G 4/1227* (2013.01); *H05K 1/111* (2013.01); *H05K 2201/10015* (2013.01)

(58) Field of Classification Search
  CPC .......... H01G 4/30; H01G 4/1227; H01G 4/12; H01G 4/008; H01G 4/005; H01G 13/00; H05K 1/181; H05K 1/111; H05K 1/18; H05K 2201/10015; H05K 3/3442
  USPC ...... 174/260; 361/321.2, 301.4, 321.5, 321.4
  See application file for complete search history.

(56) References Cited

U.S. PATENT DOCUMENTS

| | | | |
|---|---|---|---|
| 7,595,974 B2* | 9/2009 | Nakano | H01G 4/1227 361/305 |
| 2009/0290281 A1 | 11/2009 | Nagamoto et al. | |
| 2011/0114378 A1 | 5/2011 | Yoshii et al. | |
| 2012/0295122 A1 | 11/2012 | Park et al. | |
| 2013/0020905 A1* | 1/2013 | Sawada | H01G 4/012 310/311 |
| 2013/0118572 A1 | 5/2013 | Kim et al. | |
| 2014/0085767 A1* | 3/2014 | Kang | H01G 4/30 361/301.4 |
| 2017/0018362 A1* | 1/2017 | Nishisaka | H01G 4/30 |

FOREIGN PATENT DOCUMENTS

| | | | | |
|---|---|---|---|---|
| JP | 4952723 B2 | 3/2012 | | |
| JP | 2012-244150 A | 12/2012 | | |
| JP | 2015-39014 A | 2/2015 | | |
| JP | 2015039014 A | * 2/2015 | ............... | H01G 4/12 |
| JP | 2015-216339 A | 12/2015 | | |
| JP | 2015216339 A | * 12/2015 | ............. | H01G 4/232 |
| KR | 10-2013-0052527 A | 5/2013 | | |
| KR | 10-2014-0040547 A | 4/2014 | | |
| KR | 10-2015-0127339 A | 11/2015 | | |

OTHER PUBLICATIONS

Notice of Allowance issued in corresponding U.S. Appl. No. 16/181,053 dated Jul. 31, 2019.
Non-Final Office Action issued in corresponding U.S. Appl. No. 16/181,053 dated Feb. 21, 2019.

* cited by examiner

MULTILAYER CERAMIC ELECTRONIC COMPONENT AND BOARD FOR MOUNTING OF THE SAME

CROSS-REFERENCE TO RELATED APPLICATION(S)

This application is the continuation application of U.S. patent application Ser. No. 16/181,053 filed on Nov. 5, 2018, which claims the benefit of priority to Korean Patent Application No. 10-2018-0069956 filed on Jun. 19, 2018 in the Korean Intellectual Property Office, the disclosure of which is incorporated herein by reference in its entirety.

BACKGROUND

1. Field

The present disclosure relates to a multilayer ceramic electronic component having improved reliability and a board for mounting of the same.

2. Description of Related Art

With the recent trend toward miniaturization of electronic products, there is increasing demand for a multilayer ceramic electronic component having a small size and high capacity.

Along with the demand for a multilayer ceramic electronic component having a small size and high capacity, external electrodes of a multilayer ceramic electronic component have also been thinned.

An external paste contains a conductive metal such as copper (Cu) as a main material to ensure hermetic chip sealing properties and electrical connectivity in a chip. The external paste also contains a glass as an auxiliary material to provide adhesive strength between the external electrodes and the chip while filling voids during sintering shrinkage of the metal.

A glass of the external electrode paste serves to accelerate copper sintering and serves as an adhesive between a ceramic body and an external electrode. The glass fills a void, not filled with copper, to achieve complete hermetic sealing.

In general, an external electrode paste includes two or three different types of glass. In view of the nature of a typical glass, a glass with excellent acid resistance or excellent capacity contactability has poor copper wettability due to its high softening point, while a glass having excellent copper wettability has poor acid resistance or poor capacity contactability.

Conventionally, an external electrode is formed by applying, drying, and firing an external electrode paste including a single type of glass or two or three different types of glass.

In the case of such applying and firing performed once, a glass included in an external electrode paste may not satisfy all requirements such as adhesiveness of an internal electrode and an external electrode, sealing of the external electrode, wettability with copper (Cu), acid resistance, and the like.

That is, when the content of silicon (Si), one of the glass ingredients in an external electrode paste, increases, acid resistance is excellent, but wettability with copper (Cu) may be degraded and a softening point may become higher. As a result, the glass may not sufficiently fill an interface and a void in Cu metal.

On the other hand, a glass having excellent copper wettability encounters the problem that acid resistance is poor or capacity contactability is weak.

In view of the foregoing, an external electrode paste maybe prepared by including two or three types of glass capable of solving the above problems. However, in order for the respective types of glass to successfully achieve desired functions, they need to be located in desired positions in the external electrode, respectively. However, high-temperature characteristics of glass make it difficult to locate the glass at a desired position in external electrode.

SUMMARY

An aspect of the present disclosure is to provide a multilayer ceramic electronic component with improved reliability and a board for mounting of the same.

According to an aspect of the present disclosure, a multilayer ceramic electronic component includes a ceramic body including a dielectric layer, first and second internal electrodes disposed to face each other with the dielectric layer interposed therebetween in the ceramic body, and first and second external electrodes disposed on external surfaces of the ceramic body and electrically connected to the first and second electrodes. The first and second external electrodes include a first electrode layer including a first glass and a second electrode layer disposed on the first electrode layer and including a second glass. The first glass contains barium-zinc (Ba—Zn) and the second glass contains silicon (Si).

According to an aspect of the present disclosure, a board for mounting of a multilayer ceramic electronic component includes a printed circuit board including a plurality of electrode pads disposed thereon and a multilayer ceramic electronic component mounted on the printed circuit board. The multilayer ceramic electronic component includes a ceramic body including a dielectric layer, first and second internal electrodes disposed to face each other with the dielectric layer interposed therebetween in the ceramic body, and first and second external electrodes disposed on external surfaces of the ceramic body and electrically connected to the first and second electrodes. The first and second external electrodes include a first electrode layer including a first glass and a second electrode layer disposed on the first electrode layer and including a second glass. The first glass contains barium-zinc (Ba—Zn) and the second glass contains silicon (Si).

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Exemplary embodiments in the present disclosure will now be described below in detail with reference to the accompanying drawings, where those components are rendered using the same reference number that are the same or are in correspondence, regardless of the figure number, and redundant explanations are omitted.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Multilayer Ceramic Electronic Component

Exemplary embodiments in the present disclosure will be described more fully hereinafter with reference to accompanying drawings.

Figure 1:
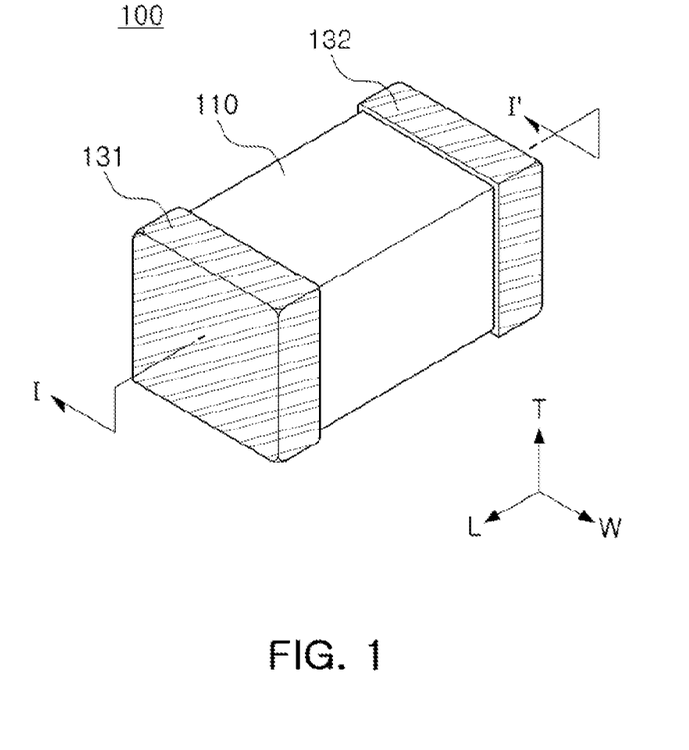
FIG. 1 is a perspective view of a multilayer ceramic capacitor according to an exemplary embodiment in the present disclosure.

FIG. 1 is a perspective view of a multilayer ceramic capacitor according to an exemplary embodiment.

Figure 2:
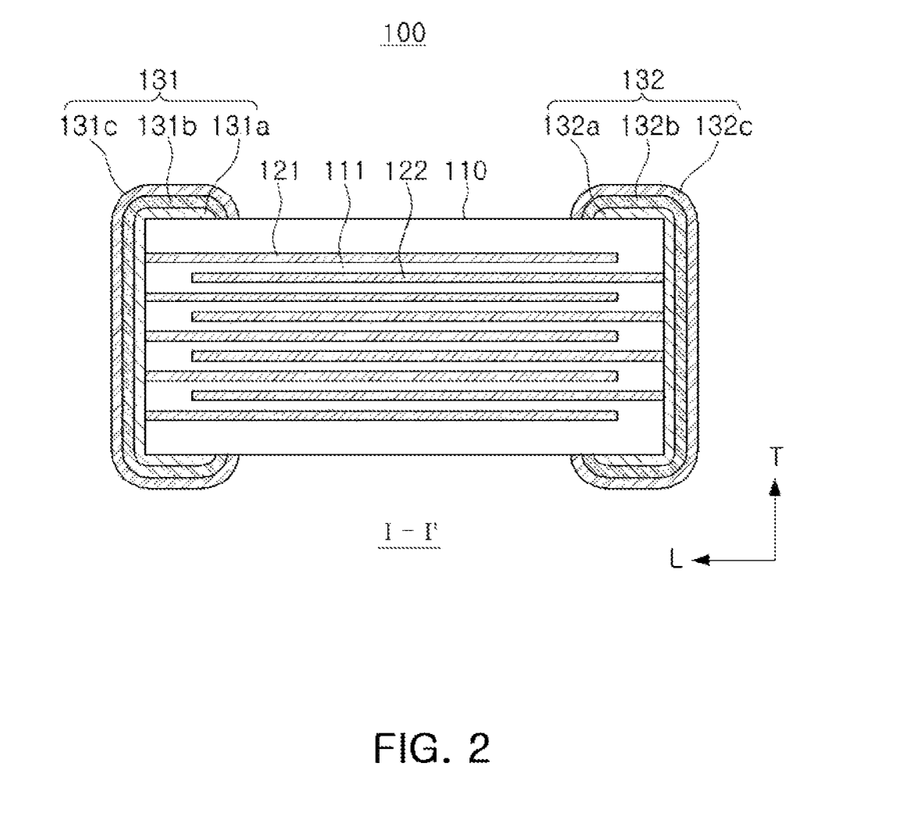
FIG. 2 is a cross-sectional view taken along line I-I' in FIG. 2.

FIG. 2 is a cross-sectional view taken along line I-I' in FIG. 1.

Referring to FIGS. 1 and 2, a multilayer ceramic electronic component 100 according to an exemplary embodiment may include a ceramic body 110 including a dielectric layer 111, a first internal electrode 121 and a second internal electrode 122 disposed to face each other with the dielectric layer 111 interposed therebetween in the ceramic body 110, and first and second external electrodes 131 and 132 disposed on external surfaces of the ceramic body 110 and electrically connected to the first and second internal electrodes 121 and 122. The first and second external electrodes 131 and 132 include first electrodes 131a and 132a including a first glass and second electrode layers 131b and 132b disposed on the first electrode layers 131a and 132a and including a second glass. The first glass includes barium-zinc (Ba—Zn), and the second glass includes silicon (Si).

Hereinafter, a multilayer ceramic electronic component according to an exemplary embodiment will be described, in particular, a multilayer ceramic capacitor will be described, but exemplary embodiments in the present disclosure are not limited thereto.

In a multilayer ceramic capacitor according to an exemplary embodiment in the present disclosure, a 'length direction,' a 'width direction,' and a 'thickness direction' will be defined as an 'L' direction, a 'W' direction, and a 'T' direction in FIG. 1, respectively. The 'thickness direction' may be used as having the same concept as a direction in which dielectric layers are laminated, i.e., a 'lamination direction.'

According to an exemplary embodiment in the present disclosure, a material for forming the dielectric layer 111 is not particularly limited as long as sufficient capacitance can be obtained therewith, and may be, for example, a barium titanate ($BaTiO_3$) powder.

A material for forming the dielectric layer 111 may be a powder such as a barium titanate ($BaTiO_3$) powder to which various ceramic additives, organic solvents, plasticizers, binders, dispersants, and the like may be added, according to objectives of the present disclosure.

A material for forming the first and second internal electrodes 121 and 122 is not particularly limited, and they may be formed using a conductive paste including at least one of, for example, silver (Ag), lead (Pb), platinum (Pt), nickel (Ni), and copper (Cu).

A multilayer ceramic capacitor according to an exemplary embodiment in the present disclosure may include a first external electrode 131 electrically connected to the first internal electrode 121 and a second external electrode 132 electrically connected to the second internal electrode 122.

The first and second external electrodes 131 and 132 may be electrically connected to the first and second internal electrodes 121 and 122 to form capacitance, and the second external electrode 132 may be connected to an electrode having a potential different from a potential of an electrode to which the first external electrode 131 is connected.

According to an exemplary embodiment in the present disclosure, the first and second external electrodes 131 and 132 include first electrodes 131a and 132a including a first glass and second electrode layers 131b and 132b disposed on the first electrode layers 131a and 132a and including a second glass. The first glass contains a larger amount of barium-zinc (Ba—Zn) than the second glass, and the second glass contains a larger amount of silicon (Si) than the first glass.

Hereinafter, structures of the first and second external electrodes 131 and 132 will be described in detail.

In general, nickel (Ni) is commonly used as a main material of an internal electrode and copper (Cu) is commonly used as a main material of an external electrode. When a glass is added to an external electrode paste, copper (Cu) contained in the external electrode may easily move to the internal electrode according to flowability of the glass.

When the copper (Cu) moving to the internal electrode meets nickel, an element constituting the internal electrode, a copper-nickel alloy may be formed through a sintering process.

The formation of the copper-nickel alloys may allow the external electrode and the internal electrode to be electrically connected to each other.

To implement the above characteristics, the first and second external electrodes 131 and 132 include first electrodes 131a and 132a including a first glass.

The first electrode layers 131a and 132a may include a conductive metal, one selected from the group consisting of copper (Cu), nickel (Ni), silver (Ag), and silver-palladium (Ag—Pd), and a first glass.

To form capacitance, the first and second external electrodes 131 and 132 may be formed at opposite ends of the ceramic body 100, respectively. The first electrode layers 131a and 132a included in the first and second external electrodes 131 and 132 may be electrically connected to the first and second internal electrodes 121 and 122.

The first electrode layers 131a and 132a may be formed by applying the conductive paste prepared by adding the first glass to the first conductive metal powder and firing the applied conductive paste.

When copper wettability of the glass is excellent, the glass may be uniformly dispersed within the external electrodes. In this case, a plating layer may be easily formed.

The sentence "copper wettability of the glass is excellent" means that the glass is not aggregated or separated within the external electrode but is uniformly distributed over the entire external electrode to prevent the glass from exuding to a surface of the external electrode.

When the copper wettability of the glass is poor, the glass may not be uniformly mixed with copper, a main material of the external electrode, and glasses tend to aggregate. Thus, the glass exudes to the surface of the external electrode. As a result, it is difficult to form plating layers 131c and 132c.

To improve the above characteristics, second electrodes 131b and 132b may be formed on the first electrode layers 131a and 132a to form a double-layer external electrode.

As an external electrode is decreasing in thickness with the trend toward miniaturization and high capacitance of products, after firing an external electrode, a plating solution may permeate the external electrode during a plating process to degrade chip reliability.

Since a glass contained in an external electrode is not excellent in terms of corrosion resistance against a plating solution, the plating solution may permeate the external electrode as the glass is corroded by the plating solution. By promoting corrosion resistance of the glass contained in the external electrode against plating solution, the plating solution may be prevented from permeating the external electrode during a plating process. Thus, chip reliability may be improved.

The second electrode layers 131b and 132b may include a conductive metal, one selected from the group consisting of copper (Cu), nickel (Ni), silver (Ag), and silver-palladium (Ag—Pd), and a second glass.

The second electrode layers 131b and 132b may be formed by applying the conductive paste prepared by adding the second glass to the second conductive metal powder and firing the applied conductive paste.

The first and second glasses are not particularly limited as long as they are typical glasses except for features to be described later and may be glasses including, for example, a silicon-based oxide or a boron-based oxide.

The first glass may contain a larger amount of Ba—Zn than the second glass.

Since the first glass may contain a larger amount of Ba—Zn than the second glass, a density of the first glass may be high.

Since contents of Ba and Zn contained in the first glass may be high, the first glass may be less acid resistant to a nickel (Ni) plating solution.

To improved the degree of acid resistance, according to an exemplary embodiment in the present disclosure, second electrode layers 131b and 132b including the second glass with excellent acid resistance maybe disposed on the first electrode layers 131a and 132a.

The second glass included in the second electrodes 131b and 132b may contain a larger amount of silicon (Si) than the first glass.

As mentioned above, since the second glass may contain a larger amount of Si than the first glass, acid resistance of the second glass may be excellent. Accordingly, when plating layers 131c and 132c are formed on the second electrode layers 131b and 132b, corrosion caused by a plating solution and permeation of the plating solution may be prevented, to improve moisture resistance reliability.

More specifically, silicon oxide ($SiO_2$) is a glass network former having a structure in which silicon atoms are bonded to four adjacent silicon atoms with four oxygen atoms interposed therebetween.

Silicon oxide ($SiO_2$) acts as the most significant factor in determining a softening temperature and a degree of acid resistance of glass. In the case that the content of silicon oxide ($SiO_2$) is low, a glass network structure may be weak, and thus, the softening temperature may be low and the acid resistance may be weak. Meanwhile, when the content of silicon oxide ($SiO_2$) is high, the glass network structure may be strong and thus the softening temperature may be high and the acid resistance may be strong.

According to an exemplary embodiment in the present disclosure, the second glass included in the second electrodes 131b and 132b contains a larger amount of silicon (Si) than the first glass. For this reason, the softening temperature of the second glass may be high and the acid resistance of the second glass may be strong. As a result, corrosion caused by a plating solution and permeation of the plating solution may be prevented.

According to an exemplary embodiment in the present disclosure, the second electrode layers 131b and 132b may contain zirconium (Zr) and dysprosium (Dy).

The second electrode layers 131b and 132b may contain Zr and Dy, which are highly bonded elements, to be excellent in preventing corrosion caused by a plating solution and permeation of the plating solution.

The second electrode layers 131b and 132b may contain a larger amount of zirconium (Zr) and dysprosium (Dy) than the first electrode layers 131a and 132a.

The second electrode layers 131b and 132b may contain a larger amount of zirconium (Zr) and dysprosium (Dy) than the first electrode layers 131a and 132a. For this reason, the first electrode layers 131a and 132a hay be high in terms of density while the second electrode layers 131b and 132b may be strong in terms of acid resistance.

According to an exemplary embodiment in the present disclosure, first and second external electrodes 131 and 132 includes first electrode layers 131a and 132a which include a first glass and second electrode 131b and 132b which are disposed on the first electrodes 131a and 132a and include a second glass. The first glass contains a larger amount of Ba—Zn than the second glass, and the second glass contains a larger amount of Si than the first glass. For this reason, permeation of a plating solution may be prevented to implement a multilayer ceramic electronic component having improved reliability.

According to an exemplary embodiment in the present disclosure, the plating layers 131c and 132c may be formed by plating and, in particular, may be nickel/tin plating layers but are not limited thereto.

Figure 3:
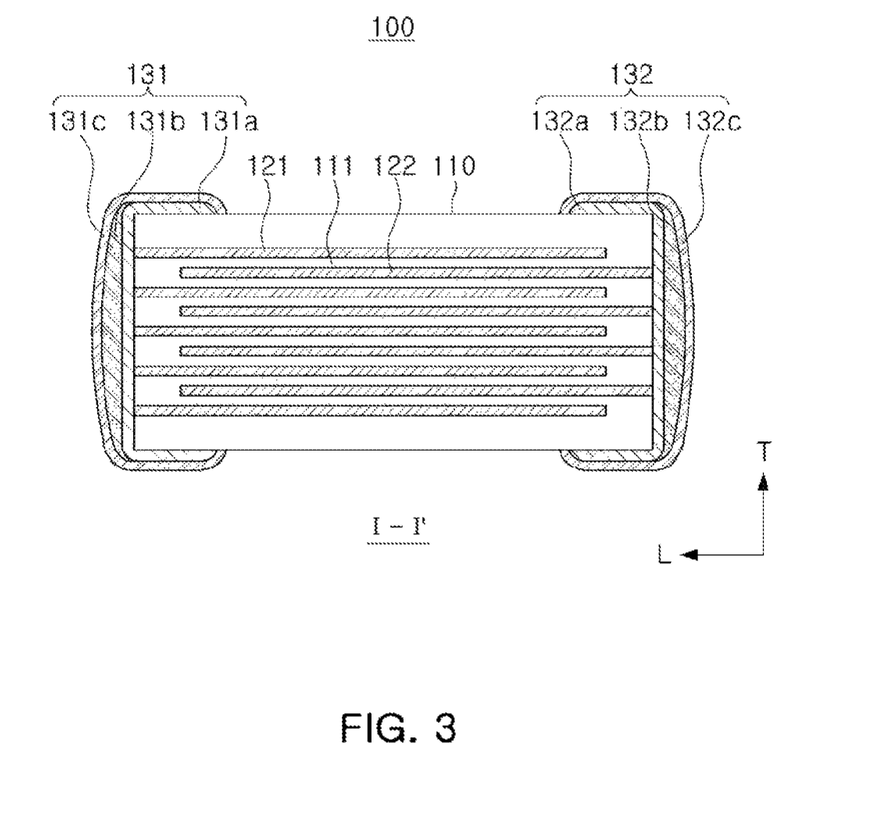
FIG. 3 is a cross-sectional view taken along line I-I' according to a first exemplary embodiment in the present disclosure.

FIG. 3 is a cross-sectional view taken along line I-I' according to a first exemplary embodiment.

Figure 4:
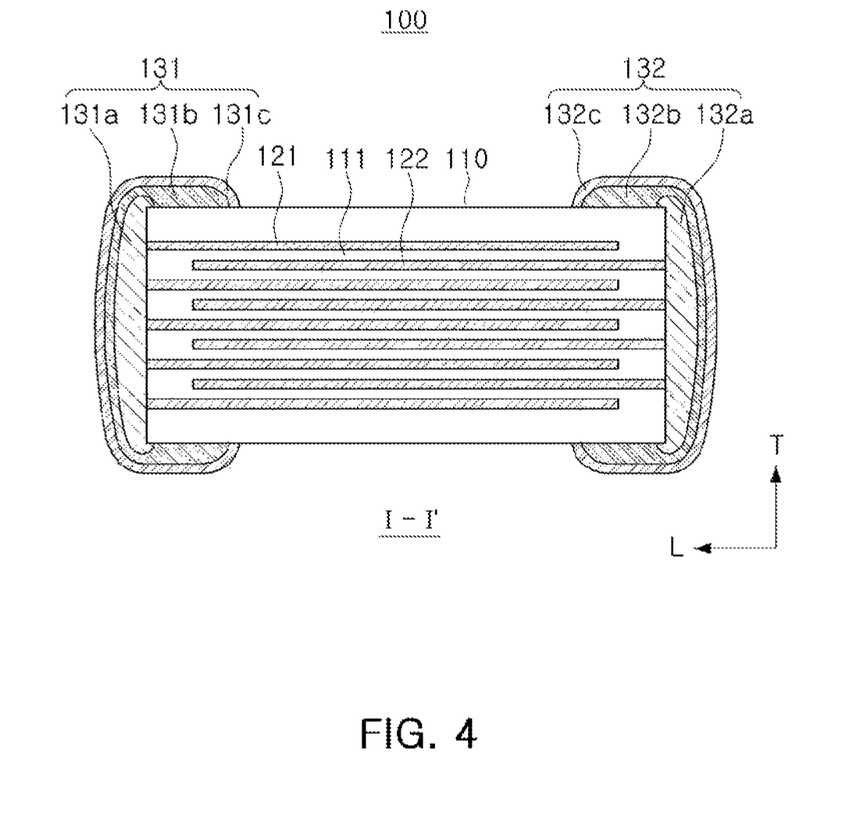
FIG. 4 is a cross-sectional view taken along line I-I' according to a second exemplary embodiment in the present disclosure.

FIG. 4 is a cross-sectional view taken along line I-I' according to a second exemplary embodiment.

Referring to FIG. 3, a multilayer ceramic capacitor 100 according to a first embodiment in the present disclosure is characterized in that the first electrodes layers 131a and 132a and the second electrode layers 131b and 132b are disposed to extend from opposing end surfaces of the ceramic body 110 in a length direction onto top and bottom surfaces of the ceramic body 110, and an extension length of the second electrodes 131b and 132b onto the top and bottom surfaces of the ceramic body 110 may be shorter than an extension length of the first electrode layers 131a and 132a onto the top and bottom surfaces of the ceramic body 110. The first electrode layers 131a and 132a extend beyond the second electrode layers 131b and 132b on the top and bottom surfaces of the ceramic body.

According to the first exemplary embodiment in the present disclosure, first electrode layers 131a and 132a having high density may be disposed to extend from opposing end surfaces of the ceramic body in a length direction to top and bottom surfaces of the ceramic body 110, and second electrode layers 131b and 132b, having excellent acid resistance, maybe disposed to cover a corner portion of the ceramic body 110, most vulnerable to permeation of a plating solution.

In this case, the second electrode layers 131b and 132b with excellent acid resistance is disposed to cover the corner portion of the ceramic body 110, most vulnerable to permeation of a plating solution, and an extension length of the second electrodes 131b and 132b onto the top and bottom surfaces of the ceramic body 110 is shorter than an extension length of the first electrode layers 131a and 132a onto the top and bottom surfaces of the ceramic body 110 to minimize a thickness of an external electrode.

Referring to FIG. 4, a multilayer ceramic capacitor 100 according to the second embodiment in the present disclosure is characterized in that the first electrode layers 131a and 132a and the second electrode layers 131b and 132b are disposed to extend from opposing end surfaces of the ceramic body 110 in a length direction to top and bottom surfaces of the ceramic body 110, and an extension length of the second electrode layers 131b and 132b onto the top and bottom surfaces of the ceramic body 110 is longer than an extension length of the first electrode layers 131a and 132a onto the top and bottom surfaces of the ceramic body 110. The second electrode layers 131b and 132b extend beyond the first electrode layers 131a and 132a on the top and bottom surfaces of the ceramic body.

According to the second exemplary embodiment in the present disclosure, in the case of an ultra-small multilayer ceramic capacitor, an extension direction of first and second electrode layers 131a and 132a from opposing end surfaces of the ceramic body in a length direction to top and bottom surfaces of the ceramic body 110 may be significantly short. Since the first electrode layers 131a and 132a include a first glass which may be significantly vulnerable to glass corrosion, the ultra-small multilayer ceramic capacitor may be vulnerable to corrosion caused by a plating solution and permeation of the plating solution.

In this case, second electrodes 131b and 132b with excellent acid resistance may be disposed to cover the first electrode layers 131a and 132a, vulnerable to permeation of the plating solution, and an extension length of the second electrode layers 131b and 132b onto the top and bottom surfaces of the ceramic body 110 may be longer than an extension length of the first electrode layers 131a and 132b onto the top and bottom surfaces of the ceramic body 110.

That is, since the second electrode layers 131b and 132b has strong acid resistance although a portion disposed to extend onto the top and bottom surfaces of the ceramic body 110 has a low thickness, corrosion caused by the plating solution and permeation of the plating solution may be prevented, to improve moisture resistance reliability.

Hereinafter, a method for manufacturing a multilayer ceramic electronic component according to another exemplary embodiment of the present disclosure will be described in detail, but the present disclosure is not limited thereto.

First, a ceramic body 110 may be prepared, including a dielectric layer 111 and first and second internal electrodes 121 and 122 disposed to face each other with the dielectric layer 111 interposed therebetween may be prepared.

The dielectric 111 may be formed as a ceramic green sheet prepared to have a thickness of several micrometers (μm) by mixing barium titanate ($BaTiO_3$) with a ceramic additive, an organic solvent, a plasticizer, a binder, and a dispersant to coat a slurry formed using a basket mill on a carrier film and to dry a resulting structure.

A conductive paste may be dispensed onto the ceramic green sheet, and an internal electrode layer may be formed of the conductive paste while a squeegee moves in one side direction.

The conductive paste may be formed of one of precious metal materials such as silver (Ag), lead (Pb), platinum (Pt), and the like, nickel (Ni), and copper (Cu) or a mixture of at least two thereof.

After the internal electrodes 121 and 122 are formed, the ceramic green sheet is removed from the carrier film. A plurality of ceramic green sheets may be laminated to overlap each other to form a multilayer structure.

The green sheet multilayer structure is compressed at high temperature and high pressure. The compressed green sheet multilayer structure may be cut into a plurality of portions having a predetermined size through a cutting process to fabricate a ceramic body.

An external electrode paste may be prepared, including a conductive metal containing 10 to 90 parts by weight of conductive metal particles having an average particle diameter of 0.3 μm or less and a first glass having a content ratio of 0.3 to 2.0 of the conductive metal.

The conductive metal may be at least one selected from the group consisting of copper (Cu), nickel (Ni), silver (Ag), and silver-palladium (Ag—Pd).

The first glass has greater contents of barium (Ba) and zinc (Zn) than a second glass to be described later.

An external electrode paste may be coated on the ceramic body 110 to be electrically connected to the first and second internal electrodes 121 and 122 to form first electrode layers 131a and 132a.

An external electrode paste including the second glass containing a larger amount of silicon (Si) than the first glass may be coated on the first electrode layers 131a and 132a to form second electrode layers 131b and 132b.

Plating layers 131c and 132c may be formed on the second electrode layers 131b and 132b by means of plating.

Finally, the ceramic body 110 may be sintered to form first and second external electrodes 131 and 132.

Board for Mounting of Multilayer Ceramic Electronic Component

Figure 5:
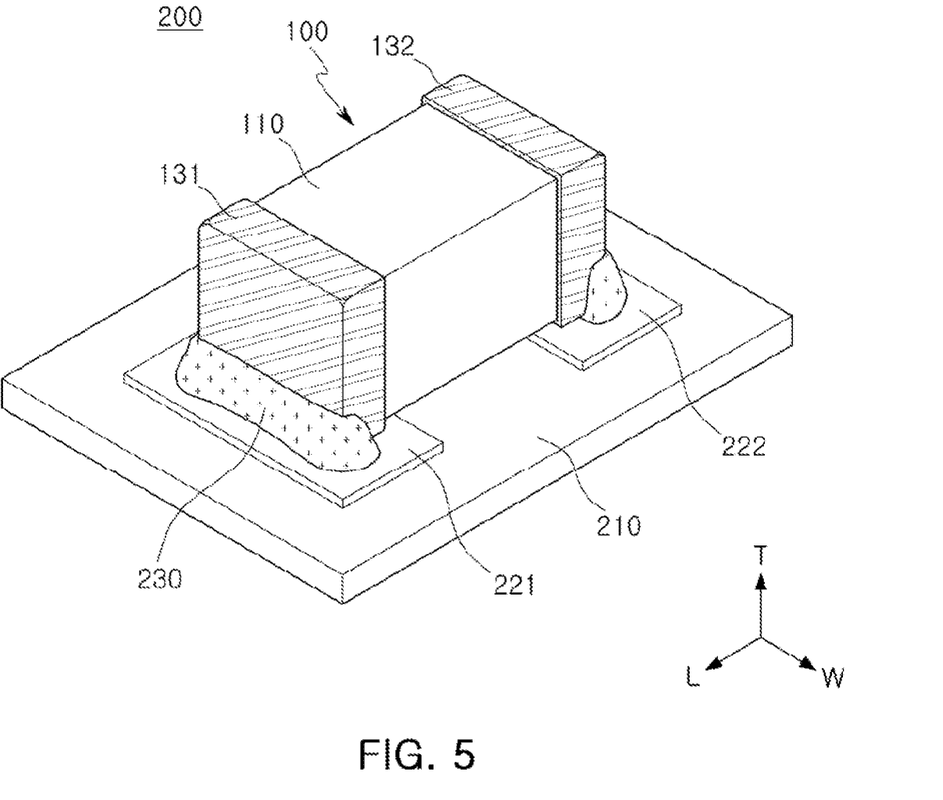
FIG. 5 is a perspective view illustrating the multilayer ceramic capacitor in FIG. 1 mounted on a printed circuit board (PCB).

FIG. 5 is a perspective view illustrating the multilayer ceramic capacitor in FIG. 1 mounted on a printed circuit board (PCB).

Referring to FIG. 5, a board 200 for mounting a multilayer ceramic electronic component according to an exemplary embodiment in the present disclosure includes a printed circuit board (PCB) 210 on which a multilayer ceramic electronic component is horizontally mounted and a plurality of electrode pads 221 and 222 disposed on a top surface of the printed circuit board to be spaced apart from each other.

The multilayer ceramic electronic component may be electrically connected to the PCB 210 by solders 230 while first and second external electrodes 131 and 132 are in contact with top surfaces of the electrode pads 221 and 222, respectively.

Except for the above explanation, duplicate explanations concerning the above-described features of the multilayer ceramic electronic component according to an exemplary embodiment in the present disclosure will be omitted hereinafter.

As described so far, according to an exemplary embodiment in the present disclosure, first and second external electrodes include a first electrode layer including a first glass and a second electrode layer disposed on the first electrode layer and including a second glass. The first glass contains a larger amount of barium-zinc (Ba—Zn) than the second glass, and the second glass contains a larger amount of silicon (Si) than the first glass. Thus, permeation of a plating solution may be prevented, to implement a multilayer ceramic electronic component having improved reliability.

While exemplary embodiments have been shown and described above, it will be apparent to those skilled in the art that modifications and variations could be made without departing from the scope of the present invention as defined by the appended claims.

What is claimed is:

1. A multilayer ceramic electronic component comprising:
a ceramic body including a dielectric layer;
first and second internal electrodes disposed to face each other with the dielectric layer interposed therebetween in the ceramic body; and
first and second external electrodes disposed on external surfaces of the ceramic body and electrically connected to the first and second internal electrodes, respectively,
wherein:
at least one selected from the group of the first and second external electrodes includes a first electrode layer including a first glass and a second electrode layer disposed on the first electrode layer and including a second glass,
the first glass contains barium-zinc (Ba—Zn) and the second glass contains silicon (Si), and the second electrode layer comprises dysprosium (Dy).

2. The multilayer ceramic electronic component of claim 1, wherein the first glass comprises a larger amount of barium-zinc (Ba—Zn) than the second glass, and the second glass comprises a larger amount of silicon (Si) than the first glass.

3. The multilayer ceramic electronic component of claim 1, wherein:
the second electrode layer comprises a larger amount of dysprosium (Dy) than the first electrode layer.

4. The multilayer ceramic electronic component of claim 1, wherein:
the first and second electrode layers extend from opposing end surfaces of the ceramic body in a length direction to top and bottom surfaces of the ceramic body, and
the first electrode layer extends beyond the second electrode layer on the top and bottom surfaces of the ceramic body.

5. The multilayer ceramic electronic component of claim 1, wherein:
the first and second electrode layers extend from opposing end surfaces of the ceramic body in a length direction to top and bottom surfaces of the ceramic body, and
the second electrode layer extends beyond the first electrode layer on the top and bottom surfaces of the ceramic body.

6. The multilayer ceramic electronic component of claim 1, wherein the first electrode layer further comprises a conductive metal selected from the group consisting of copper (Cu), nickel (Ni), silver (Ag), and silver-palladium (Ag—Pd), and
the second electrode layer further comprises a conductive metal selected from the group consisting of copper (Cu), nickel (Ni), silver (Ag), and silver-palladium (Ag—Pd).

7. The multilayer ceramic electronic component of claim 1, wherein at least one selected from the first and second external electrodes includes a plating layer disposed on the second electrode layer.

8. A board for mounting of a multilayer ceramic electronic component, comprising:
a printed circuit board including a plurality of electrode pads disposed thereon; and
a multilayer ceramic electronic component mounted on the printed circuit board,
wherein:
the multilayer ceramic electronic component includes a ceramic body including a dielectric layer, first and second internal electrodes disposed to face each other with the dielectric layer interposed therebetween in the ceramic body, and first and second external electrodes disposed on external surfaces of the ceramic body and electrically connected to the first and second electrodes, respectively,
at least one selected from the group of the first and second external electrodes includes a first electrode layer including a first glass and a second electrode layer disposed on the first electrode layer and including a second glass,
the first glass contains barium-zinc (Ba—Zn) and the second glass contains silicon (Si), and
the second electrode layer contains dysprosium (Dy).

9. The board of claim 8, wherein:
the first glass comprises a larger amount of barium-zinc (Ba—Zn) than the second glass, and the second glass comprises a larger amount of silicon (Si) than the first glass.

10. The board of claim 8, wherein:
the second electrode layer contains a larger amount of dysprosium (Dy) than the first electrode layer.

11. The board of claim 8, wherein:
the first and second electrode layers extend from opposing end surfaces of the ceramic body in a length direction to top and bottom surfaces of the ceramic body, and
the first electrode layer extends beyond the second electrode layer on the top and bottom surfaces of the ceramic body.

12. The board of claim 8, wherein:
the first and second electrode layers are disposed to extend from opposing end surfaces of the ceramic body in a length direction to top and bottom surfaces of the ceramic body, and
the second electrode layer extends beyond the first electrode layer on the top and bottom surfaces of the ceramic body.

13. The multilayer ceramic electronic component of claim 1, wherein the second electrode layer further comprises zirconium (Zr).

14. The multilayer ceramic electronic component of claim 13, wherein:
the second electrode layer comprises a larger amount of zirconium (Zr) than the first electrode layer.

15. The multilayer ceramic electronic component of claim 1, wherein the second glass comprises a larger amount of silicon (Si) than the first glass.

16. The board for mounting of a multilayer ceramic electronic component of claim 8, wherein the second electrode layer further comprises zirconium (Zr).

17. The board for mounting of a multilayer ceramic electronic component of claim 16, wherein:
the second electrode layer comprises a larger amount of zirconium (Zr) than the first electrode layer.

18. The board for mounting of a multilayer ceramic electronic component of claim 8, wherein the second glass comprises a larger amount of silicon (Si) than the first glass.

* * * * *